United States Patent
Choi et al.

(10) Patent No.: US 7,605,622 B2
(45) Date of Patent: Oct. 20, 2009

(54) DELAY LOCKED LOOP CIRCUIT

(75) Inventors: Hoon Choi, Kyoungki-do (KR); Jae-Jin Lee, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 164 days.

(21) Appl. No.: 11/478,094

(22) Filed: Jun. 30, 2006

(65) Prior Publication Data

US 2007/0069778 A1    Mar. 29, 2007

(30) Foreign Application Priority Data

Sep. 29, 2005   (KR) .................... 10-2005-0091658
Dec. 19, 2005   (KR) .................... 10-2005-0125354

(51) Int. Cl.
*H03L 7/06*    (2006.01)
(52) U.S. Cl. ...................... 327/158; 327/149
(58) Field of Classification Search ................. None
See application file for complete search history.

(56) References Cited

U.S. PATENT DOCUMENTS

| | | | |
|---|---|---|---|
| 6,198,689 B1 * | 3/2001 | Yamazaki et al. | 365/233 |
| 6,342,801 B1 * | 1/2002 | Shin | 327/175 |
| 6,456,130 B1 * | 9/2002 | Schnell | 327/156 |
| 6,525,988 B2 | 2/2003 | Ryu et al. | |
| 6,825,703 B1 * | 11/2004 | Kwak | 327/158 |
| 6,836,437 B2 | 12/2004 | Li et al. | |
| 7,046,061 B2 * | 5/2006 | Kwak | 327/158 |
| 7,154,311 B2 * | 12/2006 | Lim | 327/156 |
| 2004/0189361 A1 * | 9/2004 | Jung | 327/158 |
| 2004/0212413 A1 * | 10/2004 | Lee | 327/158 |
| 2005/0060487 A1 | 3/2005 | Barth et al. | |
| 2005/0262373 A1 | 11/2005 | Kim | |

FOREIGN PATENT DOCUMENTS

JP       2004-47066       2/2004
KR    10-2004-0091974    11/2004

* cited by examiner

*Primary Examiner*—Cassandra Cox
(74) *Attorney, Agent, or Firm*—McDermott Will & Emery LLP

(57) ABSTRACT

A DLL of a memory device having a normal mode and a power down mode includes a clock buffer for buffering an external clock signal to output an internal clock signal. A power down mode controller generates a power down mode control signal to define the normal mode or the power down mode in response to a clock enable signal. A source clock generation unit receives the internal clock signal to generate a DLL source clock signal under the control of the power down mode control signal. A phase update unit performs a phase update operation based on the DLL source clock signal to output a DLL clock signal.

33 Claims, 14 Drawing Sheets

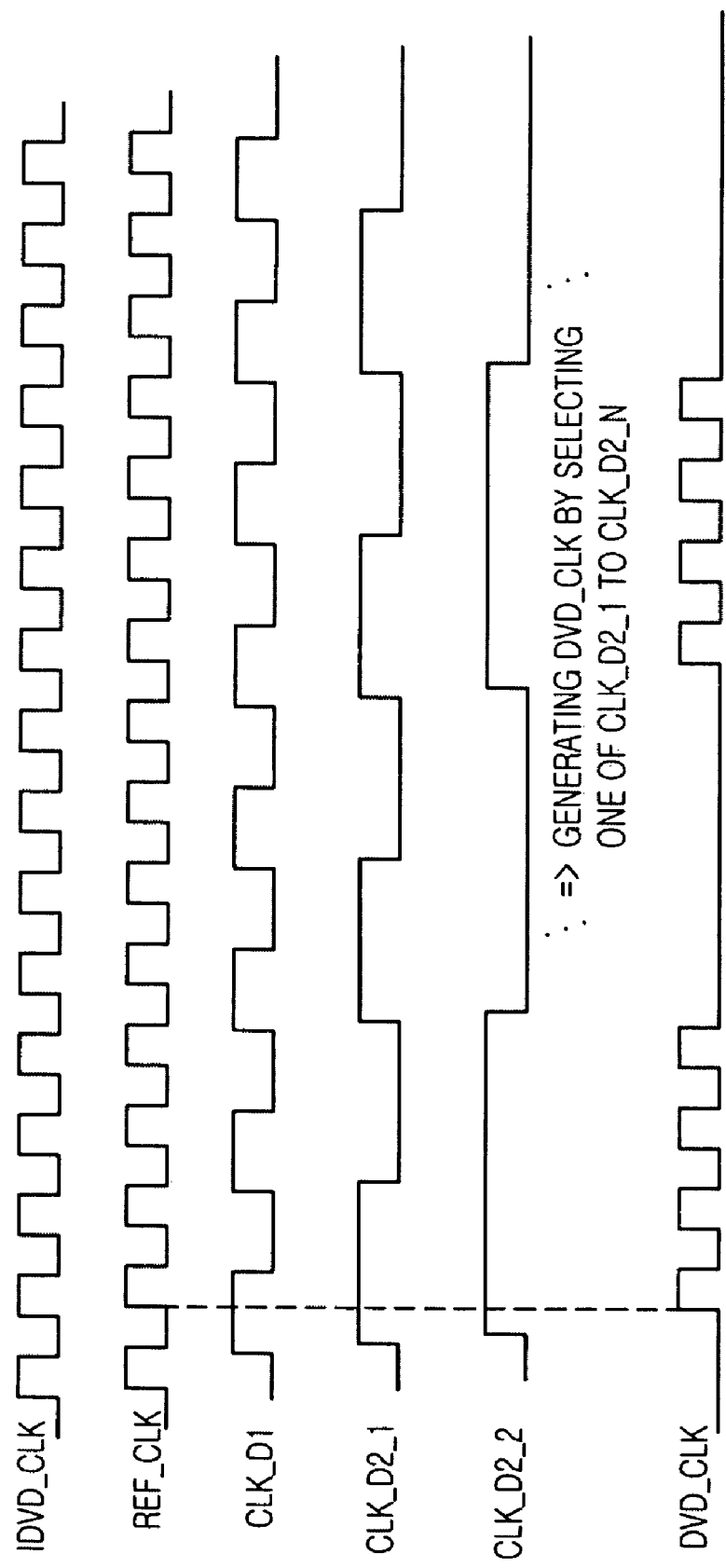

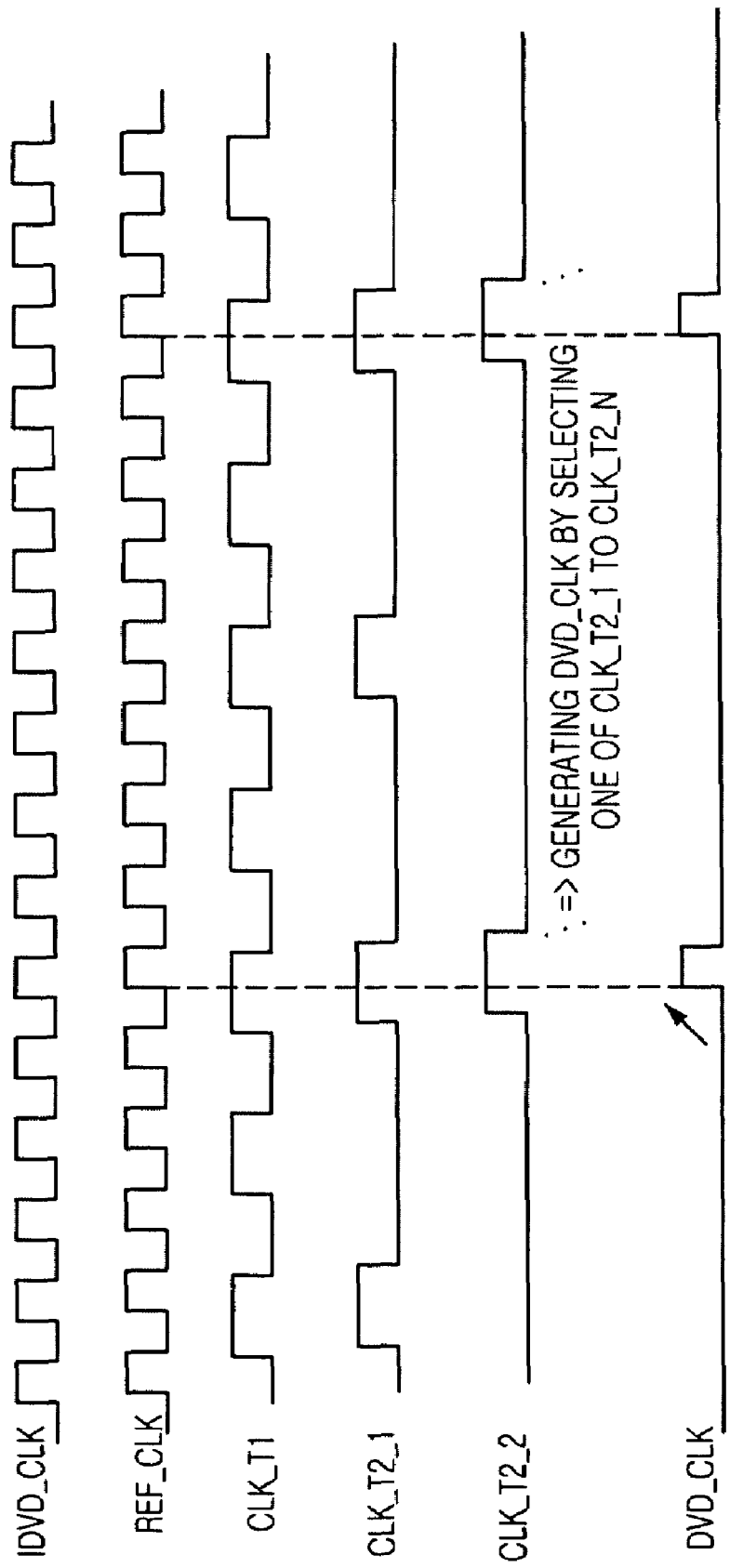

DELAY LOCKED LOOP CIRCUIT

FIELD OF THE INVENTION

The present invention relates to a delay locked loop (DLL) circuit of a synchronous DRAM; and, more particularly, to a DLL circuit for performing a stable operation in a power down mode for low power operation of a semiconductor device.

DESCRIPTION OF RELATED ARTS

A synchronous semiconductor memory device such as a double data rate synchronous DRAM (DDR SDRAM) performs data transmission with external devices using an internal clock signal locked in synchronization with an external clock signal input from an external device such as a memory controller. Time synchronization between a reference clock signal and data is important for stably transmitting the data between a memory device and a memory controller. In order to transmit the data stably, the data should be positioned accurately at an edge or a center of the clock by compensating for delay time which occurs inevitably by virtue of the time difference between the data transmission of each element and the data being loaded into a bus.

A clock synchronous circuit for compensating the delay time is a phase locked loop (PLL) or a delay locked loop (DLL). If the external clock signal is different in frequency from an internal clock signal, it is necessary to employ a frequency multiplying function. Thus, the PLL is mainly used in this case. On the contrary, if the external clock signal is equal in frequency to the internal clock signal, the DLL is used. The DLL circuit generates the internal clock signal by compensating for a clock delay component which occurs while the clock signal passing through each element is transmitted to a data output terminal inside the semiconductor memory device. Accordingly, the DLL circuit enables the clock signal used for finally in/outputting the data to be synchronized with the external clock signal. The DLL circuit has advantages in that noise is low and that it can be embodied within a small area, in comparison with the PLL circuit. Therefore, the DLL circuit generally is used as a synchronous circuit in the semiconductor memory device. Among various kinds of DLLS, recent technology provides a register controlled DLL circuit capable of reducing time which is taken in locking a first clock.

The register controlled DLL circuit has a register capable of storing a locked delay value, stores the locked delay value in the register when power is interrupted, and loads the locked delay value stored in the register when the power is turned on again so that the locked delay value is instantly used for locking the clock.

FIG. 1 is a timing diagram illustrating basic operation of a typical delay locked loop (DLL) circuit.

The DLL circuit receives an external clock signal and compensates for a delay amount by which an internal clock of the DRAM is delayed. The DLL circuit ensures that an output signal of the DRAM is in phase with the external clock signal. When the external clock and the output of the DRAM have the same phase, the data may be transferred to a chipset without error.

FIG. 2 is a block diagram illustrating a known DLL circuit. FIG. 2 is based on a register controlled DLL circuit. The DLL circuit includes a clock buffer 10, a power down mode controller 20, a clock divider 25, a phase comparator 30, a delay controller 40, a delay line 50, a dummy delay line 60, and a delay replica model 70. A DLL clock signal DLL_CLK output from the DLL circuit is transferred to an output buffer 90 through a clock signal line 80 to control output timing of the data.

The clock buffer 10 generates an internal clock signal IDVD_CLK by receiving an external clock signal CLK and an external clock bar signal CLKB and buffering them.

The power down mode controller 20 turns off the clock buffer 10 when the DRAM enters a power down mode. For low power operation of the DRAM when there is no read/write operation, the DRAM enters the power down mode according as a clock enable signal CKE becomes a logic level 'LOW'. At this time, because the clock buffer 10 does not generate the internal clock signal IDVD_CLK, the clock buffer 10 is turned off for saving a current state of the DLL circuit.

The clock divider 25 generates a DLL source clock signal DVD_CLK by dividing the internal clock signal IDVD_CLK and a reference clock signal REF_CLK by using the internal clock signal IDVD_CLK. Typically, in order to reduce power consumption of the DLL circuit, frequency of an externally applied clock becomes lower through the clock divider 25 so as to generate the DLL source clock signal DVD_CLK.

The phase comparator 30 detects a phase difference between input and output clocks of the DLL circuit by comparing phases of the input and output clocks with each other. Accordingly, the reference clock signal REF_CLK passing through the clock buffer 10 and a feedback clock signal FB_CLK fed back after passing through an internal circuit of the DLL circuit are compared with each other at the phase comparator 30. The phase comparator 30 controls the delay controller 40 on the basis of the comparison result.

The delay controller 40 is configured with a logic circuit for determining an input path of the delay line 50 and a bi-directional shift register for shifting the direction of the path. The shift register which receives four input signals and performs a shifting operation has a maximum or minimum delay by making its initial input condition such that its most right signal or most left signal is in a logic level 'HIGH'. The signals input to the shift register have two shift right signals, and two shift left signals. For shift operation, two of the signals in a logic level 'HIGH' should not overlap each other.

The delay line 50 delays a phase of the DLL source clock signal DVD_CLK outputted from the clock divider 25. The amount of the delay is determined by the phase comparator 30. The delay line 50 determines a delay path that determines the phase delay under control of the delay controller 40. The delay line 50 includes a number of unit delay cells that are serially coupled to each other. Each of the unit delay cells includes two NAND gates that are serially coupled to each other. An input of each of the unit delay cells is connected to the shift register in the delay controller 40 in one-to-one mapping. A region at which an output of the shift register becomes a logic level 'HIGH' is determined as a path through which the clock passing through the clock buffer 10 is input. The delay line 50 is constructed with two delay lines, one delay line for the rising clock and the other delay line for the falling clock in the DDR SDRAM, to suppress duty ratio distortion as much as possible by identically processing the rising edge and the falling edge.

The dummy delay line 60 is a delay line for generating a feedback clock signal FB_CLK applied to the phase comparator 30. The dummy delay line 60 is identical to the delay line 50 as illustrated above.

The delay replica model 70 is a circuit for modeling the delay factors before the external clock is input to the delay line 50 after it is input to a chip, and further delay factors until the output clock of the delay line 50 is output from the chip.

The accurate delay factors determine the deterioration value in the function of the DLL circuit. The delay replica model 70 models the clock buffer, the DLL clock driver, the R/F divider, and the output buffer, as they are.

The clock signal line 80 is a path coupling the DLL clock signal DLL_CLK of the DLL circuit to the output buffer 90.

The output buffer 90 receives the data from a memory core and outputs the data to a data output pad in synchronization with the DLL clock signal DLL_CLK of the DLL circuit.

FIG. 3 is a timing diagram illustrating an operation of the DLL of FIG. 2.

When entering a power down mode, the clock enable signal CKE transitions from a logic level 'HIGH' to a logic level 'LOW'. At this time, the DLL circuit stops performing a phase update operation in order to save the current state, and stores previously locked information to enter a frozen state. Herein, the phase update operation means that the feedback clock signal FB_CLK of the DLL circuit is compared in phase with the internal clock signal REF_CLK to be determined and continuously tracked. The frozen state means a state in which the previously locked information is stored and the phase is not further updated.

In a precharge power down mode, the time period in the power down mode is in a range of minimally three clocks to maximally 7.8 μs. During this time, the clock buffer 10 is turned off by the power down mode controller 20 so as not to generate the DLL clock signal DLL_CLK of the DLL circuit.

When the power down mode is maintained for a long time, from about MIN.3CLK to MAX.7.8 μs shown in FIG. 3, when the phase is not updated, the present locked information of the DLL circuit may be different from the previously locked information before the power down mode due to a change in circumstance of the semiconductor device, such as an external temperature change.

When exiting the power down mode under such condition, i.e., the present locked information and the previously locked information do not match with each other, the DLL clock signal DLL_CLK of the DLL circuit is different in phase in comparison with a target clock to be locked. As a result, it is difficult to exactly transmit/receive data to/from the DRAM because phase of the external clock signal is different from that of the DLL clock signal DLL_CLK of the DLL circuit.

SUMMARY OF THE INVENTION

It is, therefore, an object of the present invention to provide a delay locked loop (DLL) circuit of a semiconductor memory device for preventing a locking failure occurring from a change in a circumstance of the semiconductor device, such as an external temperature, in a power down mode for a relatively long time.

In accordance with an aspect of the present invention, there is provided a DLL of a memory device having a normal mode and a power down mode, including: a clock buffer for buffering an external clock signal to output an internal clock signal; a power down mode controller for generating a power down mode control signal to define the normal mode or the power down mode in response to a clock enable signal; a source clock generation unit for receiving the internal clock signal to generate a DLL source clock signal under the control of the power down mode control signal; and a phase update unit for performing a phase update operation based on the DLL source clock signal to output a DLL clock signal.

In accordance with another aspect of the present invention, there is provided a method for generating a DLL clock of a memory device having a normal mode and a power down mode delay locked loop, including: generating an internal clock signal by buffering an external clock; generating a first division clock signal by dividing the internal clock signal; generating a second division clock signal based on the first division clock signal; performing a DLL phase update operation based on the first division clock signal in the normal mode; and performing a DLL phase update operation based on the second division clock signal in the power down mode.

BRIEF DESCRIPTION OF THE DRAWINGS

The above and other objects and features of the present invention will become better understood with respect to the following description of the preferred embodiments given in conjunction with the accompanying drawings, in which:

FIG. 7 is a timing diagram for operation of the source clock generation unit shown in FIG. 5 in accordance with the first embodiment of the present invention;

FIG. 12 is a timing diagram for operation of the source clock generation unit shown in FIG. 10 in accordance with the second embodiment of the present invention.

DETAILED DESCRIPTION OF THE INVENTION

A delay locked loop (DLL) circuit in accordance with exemplary embodiments of the present invention will be described in detail with reference to the accompanying drawings.

Figure 1:
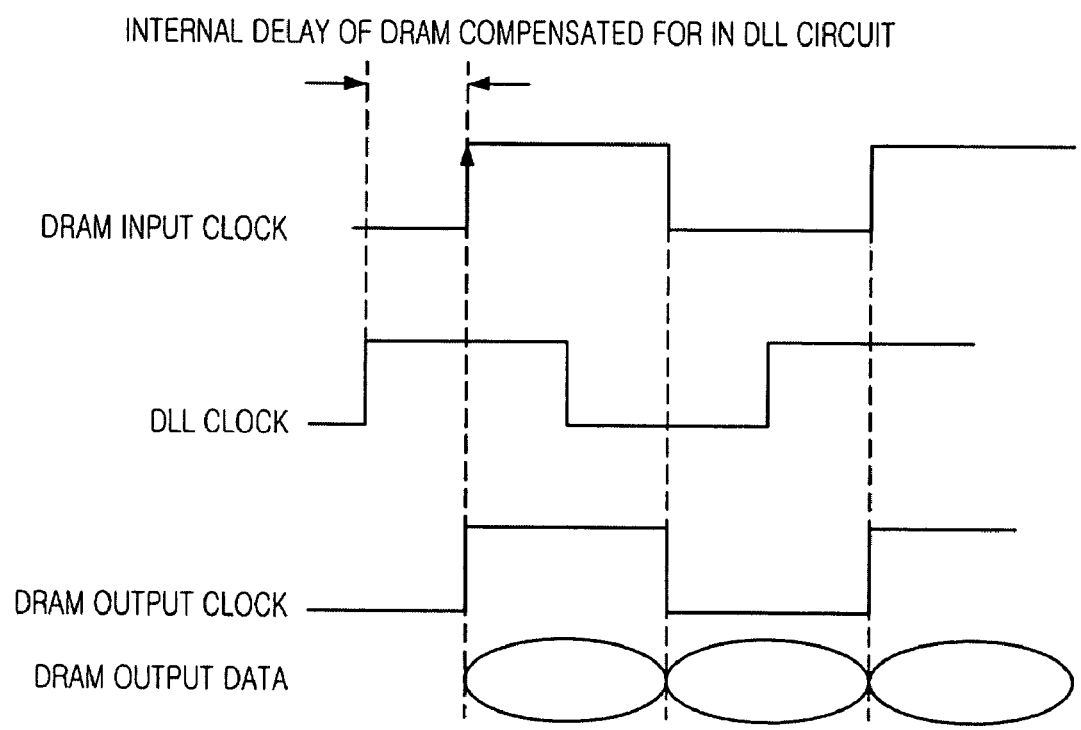
FIG. 1 is a timing diagram illustrating basic operation of a typical delay locked loop (DLL) circuit.
Figure 2:
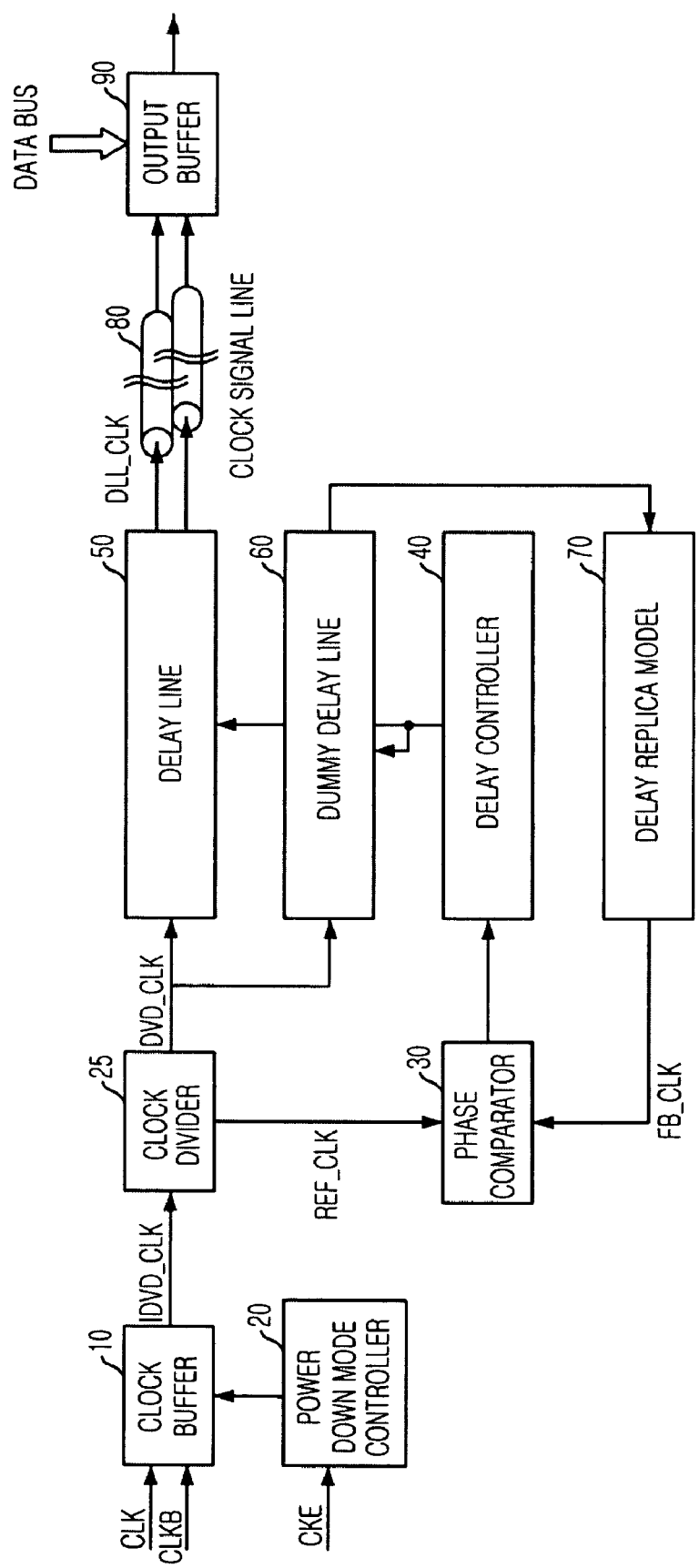
FIG. 2 is a block diagram illustrating a known DLL circuit.
Figure 3:
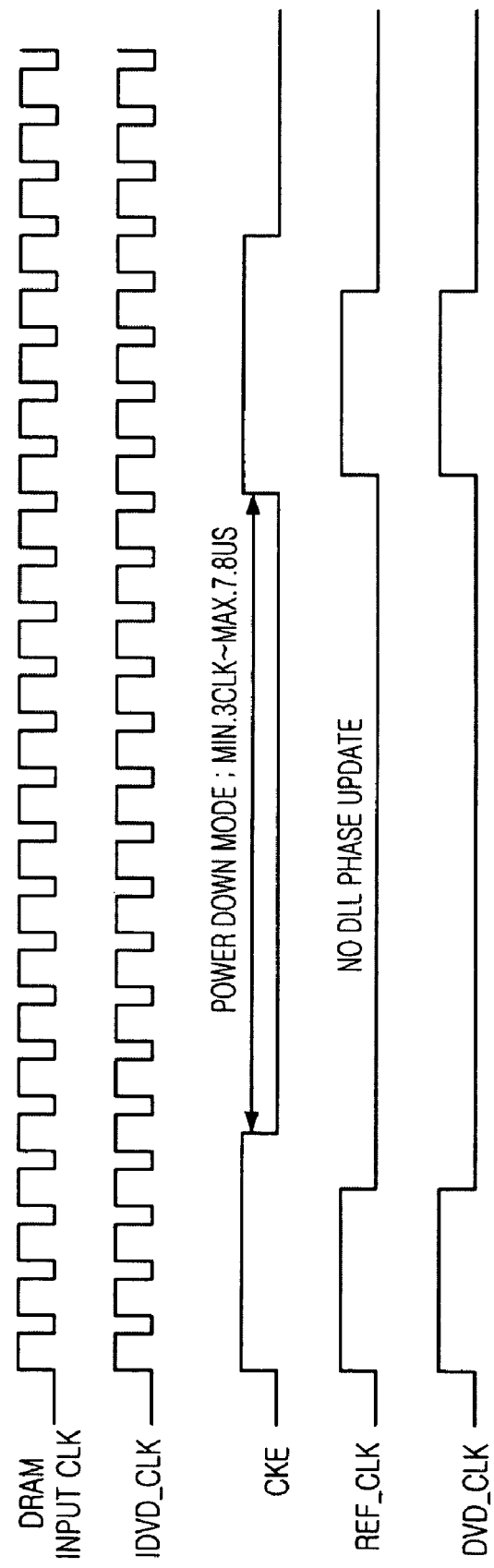
FIG. 3 is a timing diagram illustrating an operation of the DLL of FIG. 2.
Figure 4:
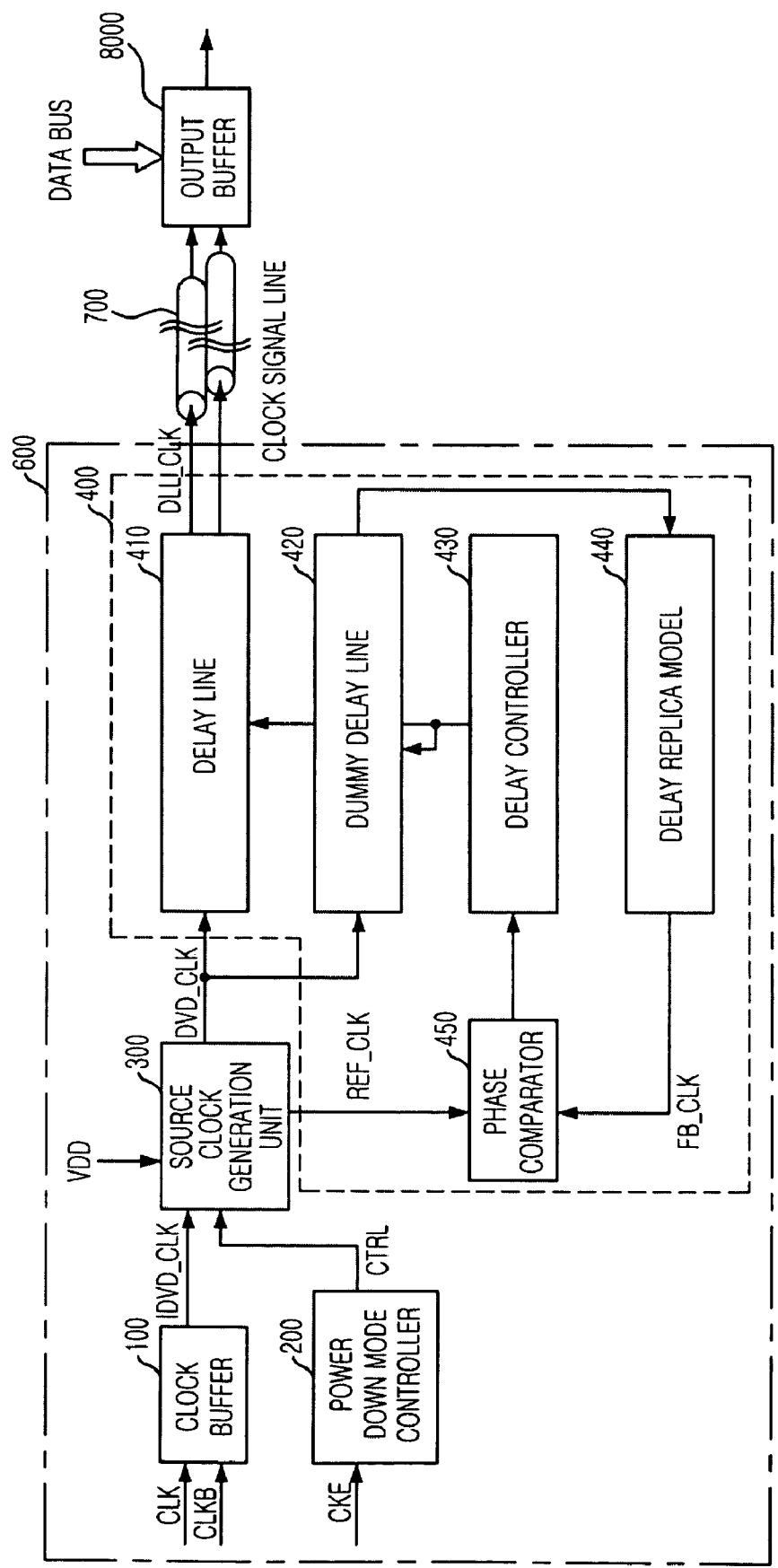
FIG. 4 is a block diagram illustrating a DLL circuit in accordance with the present invention.

FIG. 4 is a block diagram of a DLL circuit in accordance with the present invention.

The DLL circuit 600 includes a clock buffer 100, a power down mode controller 200, a source clock generation unit 300, and a phase update unit 400.

The clock buffer 100 receives and buffers an external clock signal CLK and an external clock bar signal CLKB to output the buffered signal as an internal clock signal IDVD_CLK.

The power down mode controller 200 generates a power down mode control signal CTRL having information showing whether entering a power down mode or a normal mode in response to a clock enable signal CKE.

The source clock generation unit 300 generates a DLL source clock signal DVD_CLK based on a selected section among the internal clock signal IDVD_CLK in response to the power down mode control signal CTRL indicating the power down mode or the normal mode, and receives a source voltage VDD to generate a reference clock signal REF_CLK based on the internal clock signal IDVD_CLK.

The phase update unit 400 performs a phase update operation to output a DLL clock signal DLL_CLK based on the source clock signal DVD_CLK.

The phase update unit 400 is a register controlled DLL that includes a delay line 410, a dummy delay line 420, a delay controller 430, a delay replica model 440, and a phase comparator 450.

The delay line 410 receives the DLL source clock signal DVD_CLK of the source clock generation unit 300 to delay a phase of the DLL source clock signal DVD_CLK by a predetermined time. The dummy delay line 420 is substantially identical to the delay line 410. The delay replica model 440 outputs a feedback clock signal FB_CLK by modeling an output signal of the dummy delay line 420 with delay factors of the external clock signal CLK and the external clock bar signal CLKB in a semiconductor memory device. The phase comparator 450 detects a phase difference between the reference clock signal REF_CLK of the source clock generation unit 300 and the feedback clock signal FB_CLK of the delay replica model 440. The delay controller 430 controls delay amounts of the delay line 410 and the dummy delay line 420 on the basis of an output signal of the phase comparator 450.

The DLL clock signal DLL_CLK of the DLL circuit 600 is transferred to an output buffer 800 through a clock signal line 700 to control output timing of the data.

As described above, in the present invention, the clock buffer 100 controls the source clock generation unit 300 irrespective of the power down mode control signal CTRL. That is, the clock buffer 100 continuously supplies the internal clock signal IDVD_CLK for the source clock generation unit 300 regardless of a state of the semiconductor memory device such as the power down mode and the normal mode.

Further, in the present invention, the source clock generation unit 300 generates the DLL source clock signal DVD_CLK for performing at least one phase update operation in the power down mode. Hereinafter, an operation of the source clock generation unit 300 is described in detail.

Figure 5:
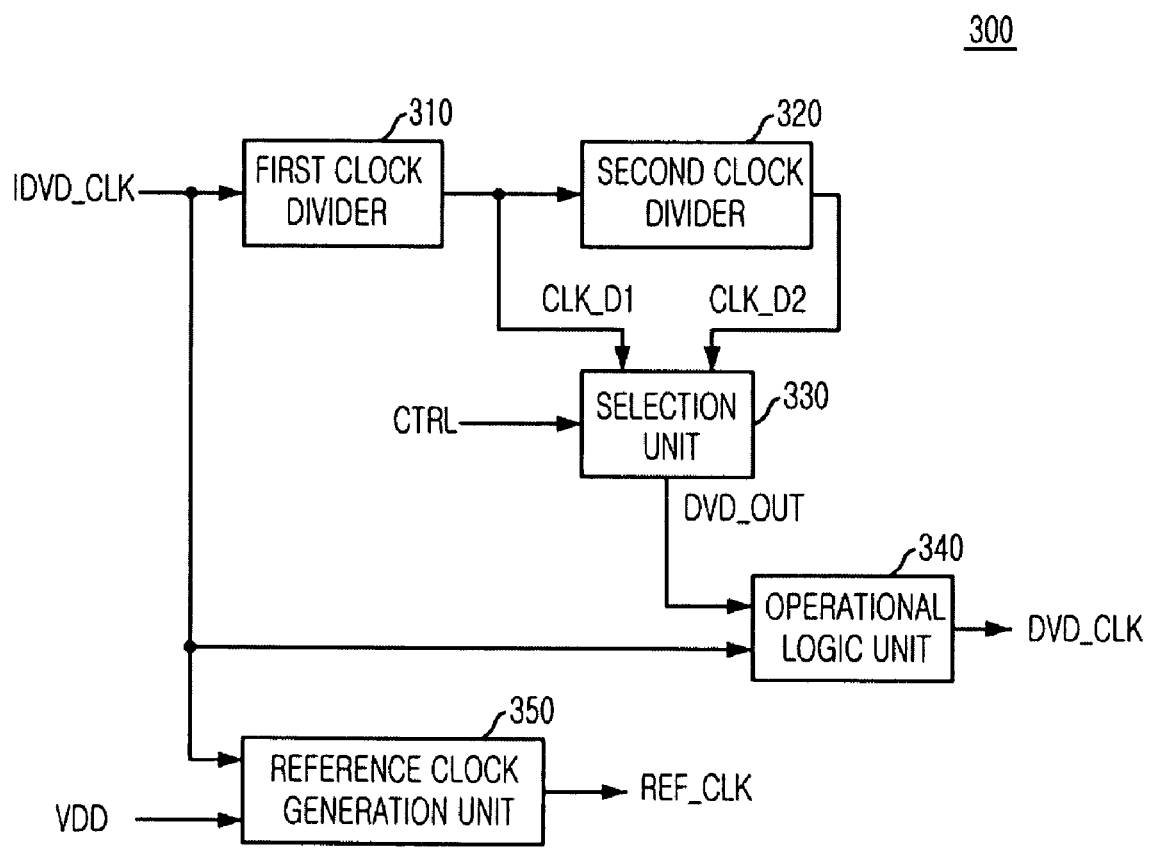
FIG. 5 is a block diagram of a source clock generation unit shown in FIG. 4 in accordance with a first embodiment of the present invention.
Figure 6A:
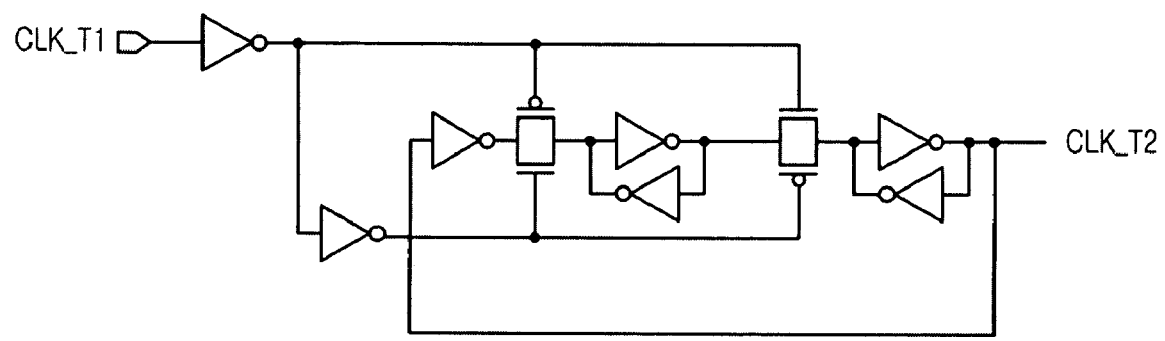
FIGS. 6A and 6B are detailed circuit diagrams of a second clock divider shown in FIG. 5.
Figure 6B:
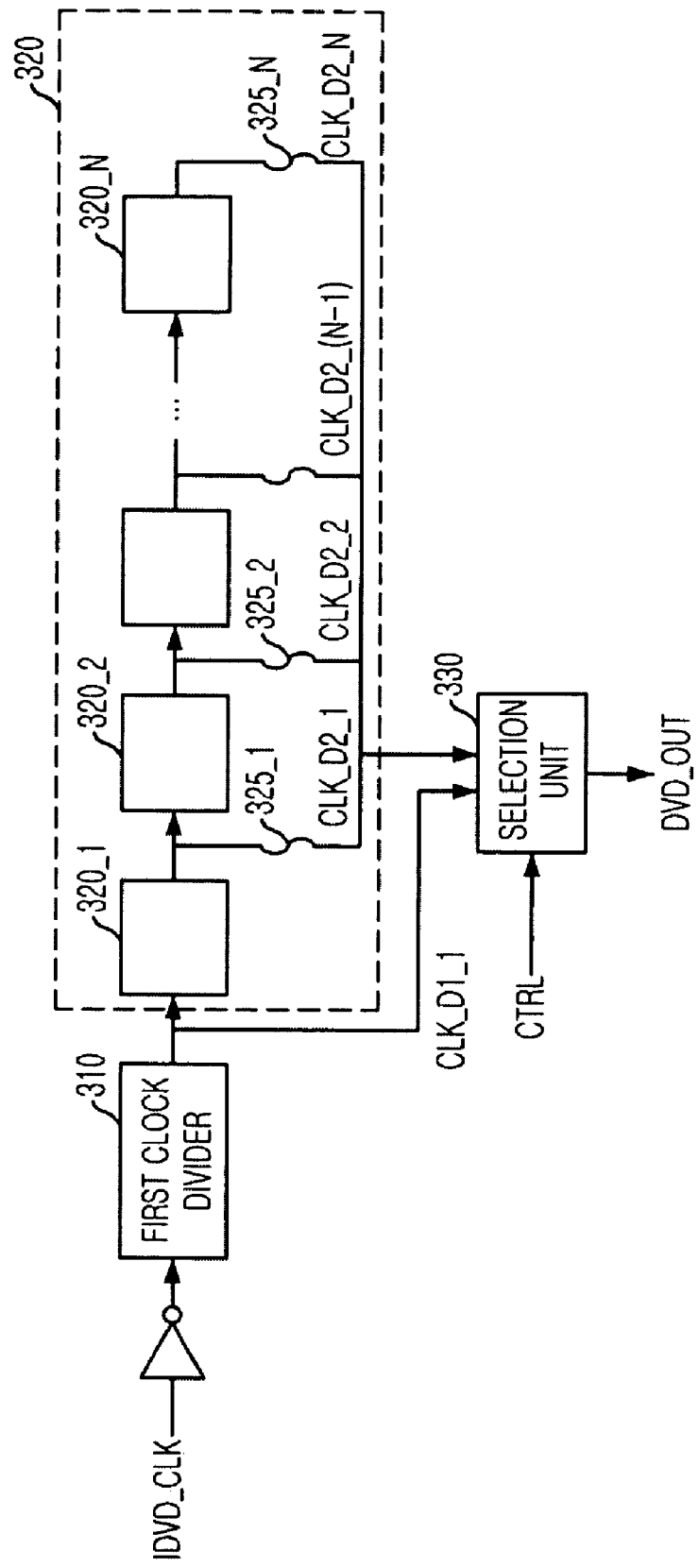

FIG. 5 is a block diagram of the source clock generation unit 300 shown in FIG. 4 in accordance with a first embodiment of the present invention; and FIGS. 6A and 6B are detailed circuit diagrams of a second clock divider shown in FIG. 5.

As shown, the source clock generation unit 300 in accordance with the first embodiment of the present invention includes first and second clock dividers 310 and 320, a selection unit 330, an operational logic unit 340, and a reference clock generation unit 350.

The first clock divider 310 generates a first division clock signal CLK_D1 to set a duration of the phase update operation in the normal mode by dividing the internal clock signal IDVD_CLK.

The second clock divider 320 generates a second division clock signal CLK_D2 to set a duration of the phase update operation in the power down mode by dividing the first division clock signal CLK_D1.

The selection unit 330 selects one of the first and second division clock signals CLK_D1 and CLK_D2 based on the power down mode control signal CTRL, thereby outputting the selected signal as a selection clock signal DVD_OUT.

The operational logic unit 340 logically combines the selection clock signal DVD_OUT and the internal clock signal IDVD_CLK to output the DLL source clock signal DVD_CLK.

The reference clock generation unit 350 generates the reference clock signal REF_CLK by performing an AND operation of the internal clock signal IDVD_CLK and the source voltage VDD.

Referring to FIG. 6A, the second clock divider 320 may include a single 2-clock divider or a single $2^n$-clock divider. Herein, n is a positive integer.

In addition, referring to FIG. 6B, the second clock divider 320 may include a plurality of unit clock dividers 320_1 to 320_N and a plurality of fuse units 325_1 to 325_N. The plurality of unit clock dividers 320_1 to 320_N are connected in series for generating a plurality of clocks having different unit clocks, e.g., CLK_D2_1 to CLK_D2_N; and the plurality of fuse units 325_1 to 325_N select one of output clocks of the plural unit dividers by blowing a selected fuse. In the present invention, it is possible to implement the second clock divider 320 by using a plurality of metal option processing units, which is manufactured during a processing, instead of the fuse units 325_1 to 325_N.

Generally, a semiconductor memory device has a power down mode period that is dependent on its specification and external circumstances. In the first embodiment of the present invention, the second division clock signal CLK_D2 for setting the section of the phase update operation in the power down mode is selected among the plurality of unit clocks, i.e., CLK_D2_1 to CLK_D2_N. Considering that the power down mode period differs according to circumstance, the second division clock signal CLK_D2 is set after testing. Accordingly, a corresponding fuse of the fuse units 325_1 to 325_N is turned on in response to the second division clock signal CLK_D2.

As described above, in accordance with the first embodiment of the present invention, the DLL source clock signal DVD_CLK is selectively generated based on the second division clock signal CLK_D2 for setting the phase update section in the power down mode. Herein, the second division clock signal CLK_D2 is selected according to the power down mode.

FIG. 7 is a timing diagram for operation of the source clock generation unit shown in FIG. 5 in accordance with the first embodiment of the present invention.

The first clock divider 310 receives and divides the internal clock signal IDVD_CLK into two, thereby outputting the divided clock signal as the first division clock signal CLK_D1. The second clock divider 320 receives and divides the first division clock signal CLK_D1 by using the plurality of unit dividers 320_1 to 320_N. As a result, outputs of the plurality of unit dividers 320_1 to 320_N are outputted as the second division clock signal CLK_D2 having the different unit clocks, i.e., CLK_D2_1 to CLK_D2_N. Each of the different unit clocks CLK_D2_1 to CLK_D2_N has various clock values, i.e., $2^1$, $2^2$ to $2^n$.

It is assumed that a second unit clock CLK_D2_2, which is divided by $2^2$, i.e., 4, and outputted through a second unit clock divider 320_2 as shown in FIG. 6B, among the second division clock signal CLK_D2 with the various unit clocks, i.e., CLK_D2_1 to CLK_D2_N, is selected for setting the section of the phase update in the power down mode.

The selection unit 330 selects the second unit clock value CLK_D2_2 as the selection clock signal DVD_OUT during the power down mode. The operational logic unit 340 logically combines the selection clock signal DVD_OUT, i.e., the second unit clock CLK_D2_2 during the power down mode, and the internal clock signal IDVD_CLK to output the DLL source clock signal DVD_CLK fit for the various section of the power down mode.

At this time, referring FIG. 7, The DLL source clock signal DVD_CLK continuously has an effective value when the second unit clock CLK_D2_2 is enabled. As a result, it is possible to accurately perform a phase update operation.

Further, it is possible to select one among the second division clock signal CLK_D2 with the various unit clocks, i.e., CLK_D2_1 to CLK_D2_N, by using the fuse units 325_1 to 325_N or the metal option processing units.

Figure 8:
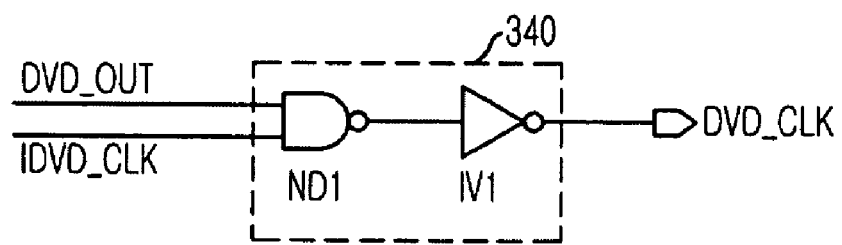
FIG. 8 is a detailed circuit diagram of an operational logic unit shown in FIG. 5.

FIG. 8 is a detailed circuit diagram of the operational logic unit 340 shown in FIG. 5.

The operational logic unit 340 includes a first NAND gate ND1 and a first inverter IV1. The first NAND gate ND1 performs a NAND operation of the internal clock signal IDVD_CLK and the selection clock signal DVD_OUT; and the first inverter IV1 inverts an output signal of the first NAND gate ND1 to output the inverted signal as the DLL source clock signal DVD_CLK.

The operational logic unit 340 performs the AND operation of the internal clock signal IDVD_CLK and the selection clock signal DVD_OUT so that an active section of the selection clock signal DVD_OUT of the selection unit 330 is longer than that of the internal clock signal IDVD_CLK which corresponds to the section of the phase update operation. As a result, a skew between the reference clock signal REF_CLK and the DLL source clock signal DVD_CLK is effectively zero.

Figure 9:
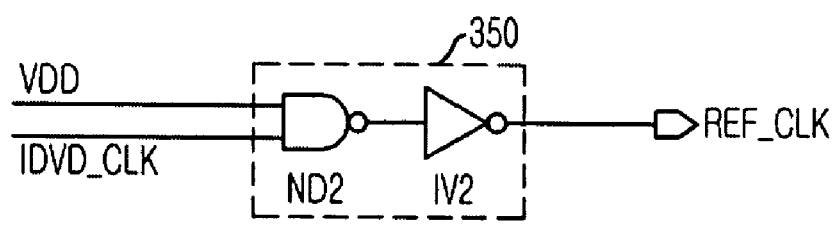
FIG. 9 is a detailed circuit diagram of a reference clock generation unit shown in FIG. 5.

FIG. 9 is a detailed circuit diagram for the reference clock generation unit 350 shown in FIG. 5.

As shown, the reference clock generation unit 350 includes a second NAND gate ND2 and a second inverter IV2. The second NAND gate ND2 performs a NAND operation of the internal clock signal IDVD_CLK and the source voltage VDD; and the second inverter IV2 inverts an output signal of the second NAND gate ND2 to output the inverted signal as the reference clock signal REF_CLK.

As described above, in accordance with the first embodiment of the present invention, the DLL source clock signal DVD_CLK is generated by selecting one of the first division clock signal CLK_D1 and the second division clock signal CLK_D2 with the various unit clocks, i.e., CLK_D2_1 to CLK_D2_N. As a result, it is possible to guarantee a stable operation of the semiconductor memory device with a low power operation by providing the DLL source clock signal DVD_CLK fit for the normal mode or the power down mode having a period according to the semiconductor memory device.

Figure 10:
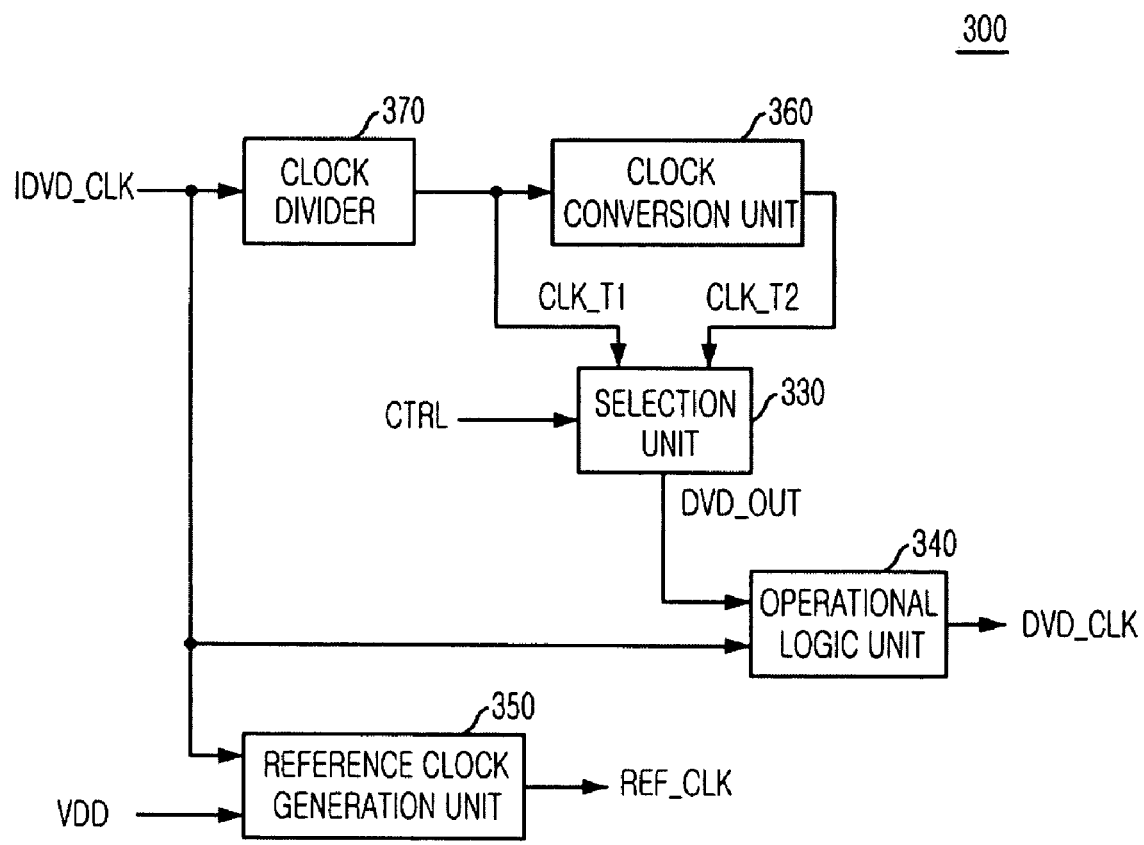
FIG. 10 is a block diagram of a source clock generation unit shown in FIG. 4 in accordance with a second embodiment of the present invention.
Figure 11A:
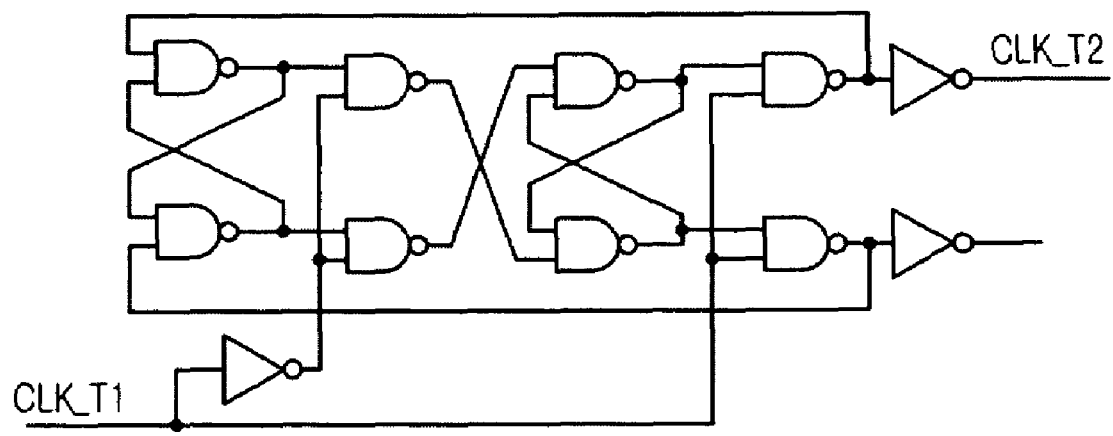
FIGS. 11A and 11B are detailed circuit diagrams for the clock conversion unit shown in FIG. 10.
Figure 11B:
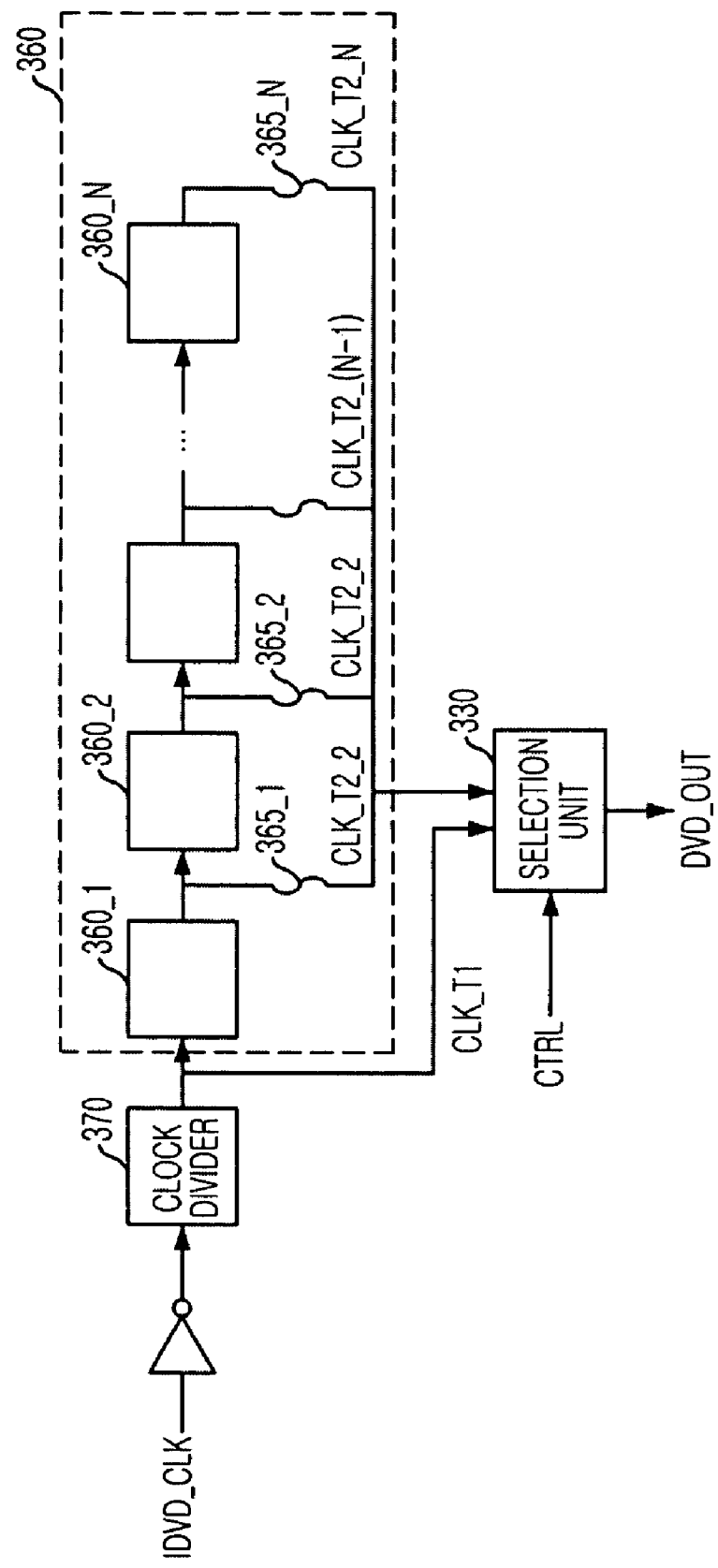

FIG. 10 is a block diagram showing the source clock generation unit shown 300 in FIG. 4 in accordance with a second embodiment of the present invention; and FIGS. 11A and 11B are detailed circuit diagrams of a clock conversion unit of the source clock generation unit 300 shown in FIG. 10.

Referring to FIG. 10, the source clock generation unit 300 in accordance with the second embodiment of the present invention includes a selection unit 330, an operational logic unit 340, a reference clock generation unit 350, a clock conversion unit 360 and a clock divider 370.

The clock divider 370 generates a first conversion clock signal CLK_T1 to set a duration of the phase update operation in the normal mode by dividing the internal clock signal IDVD_CLK.

The clock conversion unit 360 generates a second conversion clock signal CLK_T2 to set a duration of the phase update operation in the power down mode by converting the first conversion clock signal CLK_T1.

The selection unit 330 selects one of the first and second conversion clock signals CLK_T1 and CLK_T2 based on the power down mode control signal CTRL to thereby output the selected signal as a selection clock signal DVD_OUT.

The operational logic unit 340 logically combines the selection clock signal DVD_OUT and the internal clock signal IDVD_CLK to output the DLL source clock signal DVD_CLK.

The reference clock generation unit 350 generates the reference clock signal REF_CLK by performing an AND operation of the internal clock signal IDVD_CLK and the source voltage VDD.

Referring to FIG. 11A, the clock conversion unit 360 may include a single clock converter which periodically selects a section of the first conversion clock signal CLK_T1 to output the selected clock signal as the second conversion clock signal CLK_T2.

In addition, referring to FIG. 11B, the clock conversion unit 360 may include a plurality of unit clock converters 360_1 to 360_N and a plurality of fuse units 365_1 to 365_N. The plurality of unit clock converters 360_1 to 360_N are connected in series for generating a plurality of clocks having different unit clocks, e.g., CLK_T2_1 to CLK_T2_N; and the plurality of fuse units 365_1 to 365_N select one of output clocks of the plural unit clock converters by blowing a selected fuse. In the present invention, it is possible to implement the clock conversion unit 360 by using a plurality of metal option processing units instead of the fuse units 365_1 to 365_N.

Generally, a semiconductor memory device has a different power down mode period due to its specification and external circumstances. In the second embodiment of the present invention, the second conversion clock signal CLK_T2 for setting the section of the phase update operation in the power down mode is selected among the plurality of unit clocks, i.e., CLK_T2_1 to CLK_T2_N. Considering that the power down mode period differs according to the circumstance, the second conversion clock signal CLK_T2 is set after testing. Accordingly, a corresponding fuse of the fuse units 365_1 to 365_N is turned on in response to the second conversion clock signal CLK_T2.

FIG. 12 is a timing diagram for operation of the source clock generation unit 300 shown in FIG. 10 in accordance with the second embodiment of the present invention.

As shown, the clock divider 370 receives and divides the internal clock signal IDVD_CLK into two, thereby outputting the divided clock signal as the first conversion clock signal CLK_T2. The clock conversion unit 360 receives and converts the first conversion clock signal CLK_T1 by using the plurality of unit clock converters 360_1 to 360_N. As a result, outputs of the plurality of unit clock converters 360_1 to 360_N are output as the second conversion clock signal CLK_T2 having the different unit clocks, i.e., CLK_T2_1 to CLK_T2_N. Herein, the different unit clocks CLK_T2_1 to CLK_T2_N have various clock values, i.e., 2, 3 to N.

It is assumed that a second unit clock CLK_T2_2, which is converted into a third of the frequency of the first conversion clock signal CLK_T1 and outputted through a second unit clock converters 360_2 as shown in FIG. 11B, among the second conversion clock signal CLK_T2 with the various unit clocks, i.e., CLK_T2_1 to CLK_T2_N, is selected for setting the section of the phase update operation in the power down mode.

The selection unit 330 selects the second unit clock CLK_T2_2 as the selection clock signal DVD_OUT during the power down mode. The operational logic unit 340 logically combines the selection clock signal DVD_OUT2, i.e., the second clock value CLK_T2_2 during the power down mode, and the internal clock signal IDVD_CLK to output the DLL source clock signal DVD_CLK fit for the various section of the power down mode.

At this time, referring FIG. 12, The DLL source clock signal DVD_CLK continuously has an effective value only for a short time when the second unit clock CLK_T2_2 is enabled. As a result, it is possible to efficiently perform a phase update operation.

Further, it is possible to select one among the second conversion clock signal CLK_T2 with the various unit clocks, i.e., CLK_T2_1 to CLK_T2_N, by using the fuse units 365_1 to 365_N or the metal option processing units.

In the second embodiment of the present invention, the operational logic unit 340 and the reference clock generation unit 350 of the source clock generation unit 300 is the same structure as those of the first embodiment shown in FIGS. 8 and 9.

As described above, in accordance with the second embodiment of the present invention, the DLL source clock signal DVD_CLK is generated by selecting one of the first conversion clock signal CLK_T1 and the second conversion clock signal CLK_T2 with the various unit clocks, i.e., CLK_T2_1 to CLK_T2_N. At this time, each of the first and second conversion clock signals CLK_T1 and CLK_T2 has the same active section and a different period. As a result, it is possible to guarantee a stable operation of the semiconductor memory device with a low power operation by providing the DLL source clock signal DVD_CLK fit for the normal mode or the power down mode having the time period according to the semiconductor memory device.

Figure 13A:
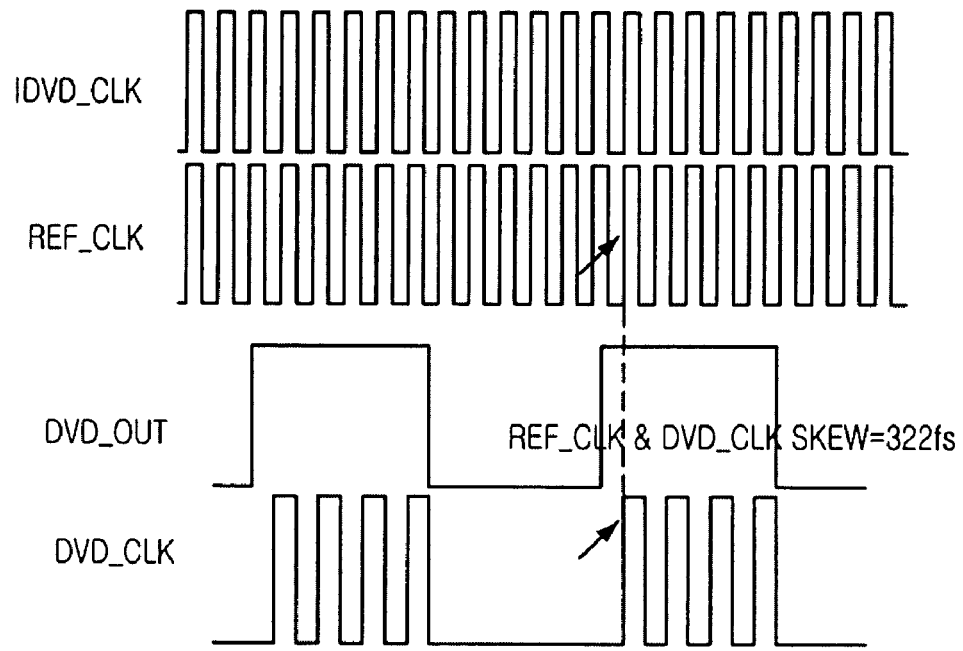
FIGS. 13A and 13B are timing diagrams depicting simulation results applying the source clock generation units in accordance with the first and second embodiments of the present invention, respectively.
Figure 13B:
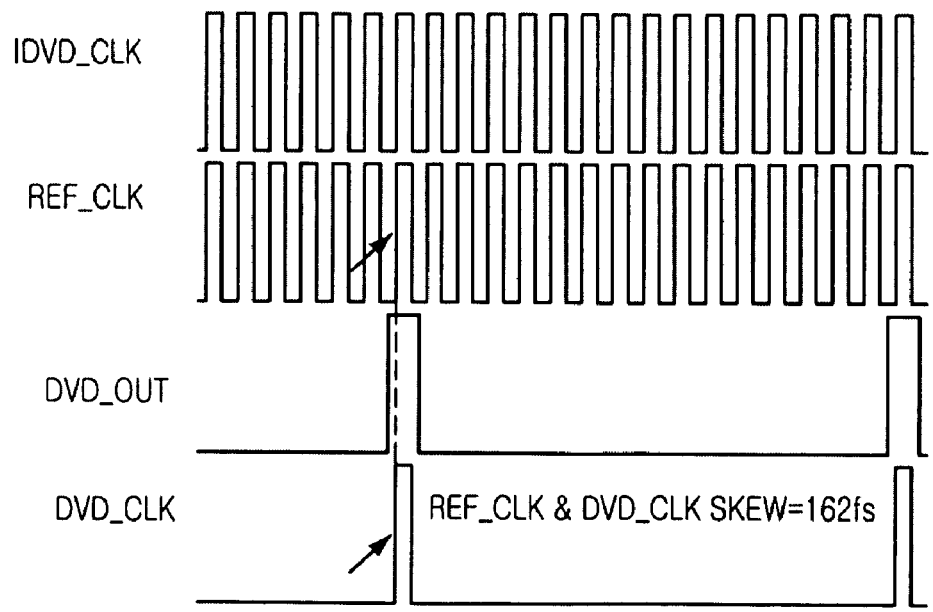

FIGS. 13A and 13B are timing diagrams depicting simulation results applying the source clock generation units in accordance with the first and second embodiments of the present invention, respectively.

As shown in FIG. 13A, in accordance with the first embodiment, a skew between the reference clock signal REF_CLK and the DLL source clock signal DVD_CLK is about 162 fs. In addition, as shown in FIG. 13B, in accordance with the second embodiment, a skew between the reference clock signal REF_CLK and the DLL source clock signal DVD_CLK is about 322 fs. Therefore, each skew of the first and second embodiments is effectively zero.

Hereinafter, referring to FIGS. 4 to 9, a method for generating a DLL clock signal in a synchronous memory device having a normal mode and a power down mode in accordance with the first embodiment of the present invention will be described.

First, the clock buffer 100 generates the internal clock signal IDVD_CLK by receiving the external clock signal CLK and the external clock bar signal CLKB; the first clock divider 310 of the source clock generation unit 300 divides the internal clock signal IDVD_CLK to generate the first division clock signal CLK_D1 for setting the section of the phase update operation in the normal mode. The second clock divider 320 divides the first division clock signal CLK_D1 to generate the second division clock signal CLK_D2 for setting the section of the phase update operation in the power down mode.

The selection unit 330 selects and outputs the first division clock signal CLK_D1 for the normal mode and the second division clock signal CLK_D2 for the power down mode, based on the power down mode control signal CTRL. The operational logic unit 340 outputs the DLL source clock signal DVD_CLK based on the first division clock signal CLK_D1 and the internal clock signal IDVD_CLK in case of the normal mode, and based on the second division clock signal CLK_D2 and the internal clock signal IDVD_CLK in case of the power down mode.

In detail, the steps of the phase update operation in the normal mode are described as follows.

First, the reference clock generation unit 350 of the source clock generation unit 300 performs the AND operation of the internal clock signal IDVD_CLK and the source voltage VDD to output the reference clock signal REF_CLK; the operational logic unit 340 performs the AND operation of the internal clock signal IDVD_CLK and the first division clock signal CLK_D1 to output the DLL source clock signal DVD_CLK for the phase update operation in the normal mode.

The delay line 410 receives the DLL source clock signal DVD_CLK to output the DLL clock signal DLL_CLK. Also, the dummy delay line 420 and the delay replica model 440 generate the feedback clock signal FB_CLK by modeling the DLL source clock signal DVD_CLK.

The phase comparator 450 compares the feedback clock signal FB_CLK with the reference clock signal REF_CLK output from the source clock signal generation unit 300; the delay controller 430 controls the delay amount of the delay line 410 and the dummy delay line 420 to perform the phase update operation in the normal mode.

Likewise, the steps of the phase update operation in the power down mode are described as follows.

First, the reference clock generation unit 350 of the source clock generation unit 300 performs the AND operation of the internal clock signal IDVD_CLK and the source voltage VDD to output the reference clock signal REF_CLK; the operational logic unit 340 performs the AND operation of the internal clock signal IDVD_CLK and the second division clock signal CLK_D2 to output the DLL source clock signal DVD_CLK for the phase update operation in the power down mode.

The delay line 410 receives the DLL source clock signal DVD_CLK to output the DLL clock signal DLL_CLK. Also, the dummy delay line 420 and the delay replica model 440 generate the feedback clock signal FB_CLK by modeling the DLL source clock signal DVD_CLK.

The phase comparator 450 compares the feedback clock signal FB_CLK with the reference clock signal REF_CLK outputted from the source clock signal generation unit 300; and the delay controller 430 controls the delay amount of the delay line 410 to perform the phase update operation in the power down mode.

As above described, in accordance with the present invention, when a faster phase update operation is required such as in the normal mode, the internal clock signal is divided by a small amount to thereby performing the phase update operation with a high frequency. When power consumption is decreased such as in the power down mode, the internal clock signal is divided by a large amount to thereby perform the phase update operation more than one time at low frequency.

Accordingly, in the present invention, even through the semiconductor memory device stays in the power down mode for a long time, the source clock generation unit effectively prevents a DLL locking failure to thereby operate more stably.

In the known configurations, as describe above, the source clock generation unit is implemented with the clock divider which generates a clock with a fixed clock frequency. In contrast, in the present invention, the source clock generation unit may include the clock conversion unit for converting a clock with a variable clock frequency. As a result, it is possible to reduce power consumption of the semiconductor memory device.

The present application contains subject matter related to the Korean patent application Nos. KR 2005-91658 & 2005-125354, filed in the Korean Patent Office on Sep. 29, 2005 &

Dec. 19, 2005, respectively, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A delay locked loop (DLL) of a memory device having a normal mode and a power down mode, comprising:
   a clock buffer for buffering an external clock signal to output an internal clock signal;
   a power down mode controller for generating a power down mode control signal to define the normal mode or the power down mode in response to a clock enable signal;
   a source clock generation unit for receiving the internal clock signal to generate a DLL source clock signal under the control of the power down mode control signal; and
   a phase update unit for performing a phase update operation based on the DLL source clock signal to output a DLL clock signal,
   wherein the source clock generation unit generates the DLL source clock signal for performing the phase update operation at least one time during the power down mode, and
   wherein the source clock generation unit includes a first clock divider for generating a first division clock signal to set a duration of the phase update operation in the normal mode by dividing the internal clock signal and a second clock divider for generating a second division clock signal to set a duration of the phase update operation in the power down mode by dividing the first division clock signal.

2. The DLL as recited in claim 1, wherein the source clock generation unit includes a selection unit that selects the first division clock signal for the normal mode and the second division clock signal for the power down mode.

3. The DLL as recited in claim 1, wherein the first clock divider includes a 2-clock divider.

4. The DLL as recited in claim 1, wherein the first clock divider includes a $2^n$-clock divider, n being a positive integer.

5. The DLL as recited in claim 1, wherein the second clock divider includes:
   a plurality of unit dividers connected in series for generating a plurality of clocks, each of which has a different unit clock from the other clocks; and
   a plurality of fuse units for selecting one of clocks outputted from the plurality of unit dividers by blowing a selected fuse among the plurality of fuses.

6. The DLL as recited in claim 1, wherein the second clock divider includes:
   a plurality of unit dividers connected in series for generating a plurality of clocks, each of which has a different unit clock from the other clocks; and
   a plurality of option process units for selecting one of clocks outputted from the plurality of unit dividers by using a metal option process unit.

7. The DLL as recited in claim 1, wherein the source clock generation unit includes an operational logic unit that includes:
   a NAND gate for performing a NAND operation of the internal clock signal and the selection clock signal; and
   an inverter for inverting an output signal of the NAND gate to output the DLL source clock signal.

8. The DLL as recited in claim 1, wherein the source clock generation unit includes a reference clock generation unit for generating a reference clock signal by performing an AND operation of the internal clock signal and a source voltage.

9. The DLL as recited in claim 8, wherein the phase update unit includes:
   a delay line for delaying a phase of the DLL source clock signal to output the DLL clock signal;
   a dummy delay line having substantially the same composition as that of the delay line;
   a delay replica model for modeling an output signal of the dummy delay line as delay factors of a clock signal in the memory device, thereby outputting the modeled signal as a feedback clock signal;
   a phase comparator for comparing the reference clock signal and the feedback clock signal to detect a phase difference therebetween; and
   a delay controller for receiving an output signal of the phase comparator to control delay amounts of the delay line and the dummy delay line.

10. A delay locked loop (DLL) of a memory device having a normal mode and a power down mode, comprising: a clock buffer for buffering an external clock signal to output an internal clock signal; a power down mode controller for generating a power down mode control signal to define the normal mode or the power down mode in response to a clock enable signal; a source clock generation unit for receiving the internal clock signal to generate a DLL source clock signal under the control of the power down mode control signal; and a phase update unit for performing a phase update operation based on the DLL source clock signal to output a DLL clock signal, wherein the source clock generation unit generates the DLL source clock signal for performing the phase update operation at least one time during the power down mode, wherein the source clock generation unit includes:
   a clock divider for generating a first conversion clock signal to set a duration of the phase update operation in the normal mode by dividing the internal clock signal;
   a clock conversion unit for generating a second conversion clock signal to set a duration of the phase update operation in the power down mode by converting the first conversion clock signal;
   a selection unit for selecting one of the first and second conversion clock signals based on the power down mode control signal to thereby output the selected signal as a selection clock signal; and
   an operational logic unit for logically combining the selection clock signal and the internal clock signal to output the DLL source clock signal.

11. The DLL as recited in claim 10, wherein the selection unit selects the first conversion clock signal for the normal mode and the second conversion clock signal for the power down mode.

12. The DLL as recited in claim 10, wherein the clock divider includes a 2-clock divider.

13. The DLL as recited in claim 10, wherein the clock conversion unit includes a clock converter which periodically selects a part of the first conversion clock signal to output the selected clock signal as the second conversion clock signal.

14. The DLL as recited in claim 10, wherein the clock conversion unit includes:
   a plurality of unit clock converters connected in series for generating a plurality of clocks, each of which has a different unit clock from the other clocks; and
   a plurality of fuse units for selecting one of clocks outputted from the plurality of unit clock converters by blowing a selected fuse among the plurality of fuses.

15. The DLL as recited in claim 10, wherein the clock conversion unit includes:

a plurality of unit clock converters connected in series for generating a plurality of clocks, each of which has a different unit clock from the other clocks; and a plurality of option process units for selecting one of clocks outputted from the plurality of unit clock converters by using a metal option process unit.

16. The DLL as recited in claim 10, wherein the source clock generation unit includes a reference clock generation unit for generating a reference clock signal by performing an AND operation of the internal clock signal and a source voltage.

17. The DLL as recited in claim 16, wherein the phase update unit includes:
a delay line for delaying a phase of the DLL source clock signal to output the DLL clock signal;
a dummy delay line having substantially the same composition as that of the delay line;
a delay replica model for modeling an output signal of the dummy delay line as delay factors of a clock signal in the memory device, thereby outputting the modeled signal as a feedback clock signal;
a phase comparator for comparing the reference clock signal and the feedback clock signal to detect a phase difference therebetween; and
a delay controller for receiving an output signal of the phase comparator to control delay amounts of the delay line and the dummy delay line.

18. A delay locked loop (DLL) of a memory device having a normal mode and a power down mode, comprising: a clock buffer for buffering an external clock signal to output an internal clock signal; a power down mode controller for generating a power down mode control signal to define the normal mode or the power down mode in response to a clock enable signal; a source clock generation unit for receiving the internal clock signal to generate a DLL source clock signal under the control of the power down mode control signal; and a phase update unit for performing a phase update operation based on the DLL source clock signal to output a DLL clock signal, wherein the source clock generation unit generates the DLL source clock signal for performing the phase update operation at least one time during the power down mode, wherein the source clock generation unit includes:
a first clock conversion unit;
a second clock conversion unit;
a selection unit for selecting one of output signals of the first and second clock conversion units based on the power down mode control signal to thereby output the selected signal as a selection clock signal; and
an operational logic unit for logically combining the selection clock signal and the internal clock signal to output the DLL source clock signal.

19. The DLL as recited in claim 18, wherein the first clock conversion unit generates a first conversion clock signal to set a duration of the phase update operation in the normal mode by converting the internal clock signal and the second clock conversion unit generates a second conversion clock signal to set a duration of the phase update operation in the power down mode by converting the first conversion clock signal.

20. The DLL as recited in claim 19, wherein the selection unit selects the first conversion clock signal for the normal mode and the second conversion clock signal for the power down mode.

21. The DLL as recited in claim 19, wherein the first clock conversion unit includes a 2-clock divider.

22. The DLL as recited in claim 19, wherein the second clock conversion unit includes a clock converter which periodically selects a part of the first conversion clock signal to output the selected clock signal as the second conversion clock signal.

23. The DLL as recited in claim 19, wherein the second clock conversion unit includes:
a plurality of unit clock converters connected in series for generating a plurality of clocks, each of which has a different unit clock from the other clocks; and
a plurality of fuse units for selecting one of clocks outputted from the plurality of unit clock converters by blowing a selected fuse among the plurality of fuses.

24. The DLL as recited in claim 19, wherein the second clock conversion unit includes:
a plurality of unit clock converters connected in series for generating a plurality of clocks, each of which has a different unit clock from the other clocks; and
a plurality of option process units for selecting one of clocks outputted from the plurality of unit clock converters by using a metal option process unit.

25. The DLL as recited in claim 19, wherein the source clock generation unit includes a reference clock generation unit for generating a reference clock signal by performing an AND operation of the internal clock signal and a source voltage.

26. The DLL as recited in claim 25, wherein the phase update unit includes:
a delay line for delaying a phase of the DLL source clock signal to output the DLL clock signal;
a dummy delay line having substantially the same composition as that of the delay line;
a delay replica model for modeling an output signal of the dummy delay line as delay factors of a clock signal in the memory device, thereby outputting the modeled signal as a feedback clock signal;
a phase comparator for comparing the reference clock signal and the feedback clock signal to detect a phase difference therebetween; and
a delay controller for receiving an output signal of the phase comparator to control delay amounts of the delay line and the dummy delay line.

27. A method for generating a DLL clock of a memory device having a normal mode and a power down mode, comprising:
generating an internal clock signal by buffering an external clock;
generating a first division clock signal by dividing the internal clock signal;
generating a second division clock signal based on the first division clock signal; performing a DLL phase update operation based on the first division clock signal in the normal mode; and
performing a DLL phase update operation based on the second division clock signal in the power down mode.

28. The method as recited in claim 27, wherein generating the second division clock signal includes dividing the first division clock signal.

29. The method as recited in claim 27, wherein generating the second division clock signal includes converting the first division clock signal.

30. The method as recited in claim 27, wherein the first division clock signal is for setting a duration of the phase update operation in the normal mode.

31. The method as recited in claim 27, wherein the second division clock signal is for setting a duration of the phase update operation in the power down mode.

32. The method as recited in claim 27, wherein performing the DLL phase update operation based on the first division clock signal includes:
- generating a reference clock signal by performing an AND operation of the internal clock signal and a source voltage;
- generating a DLL source clock signal by performing an AND operation of the internal clock signal and the first division clock signal;
- generating a feedback clock signal by modeling the DLL source clock signal with delay factors of the memory device; and
- controlling a delay amount of the DLL source clock signal by comparing the feedback clock signal with the reference clock signal.

33. The method as recited in claim 27, wherein the step of performing the DLL phase update operation based on the second division clock signal includes:
- generating a reference clock signal by performing an AND operation of the internal clock signal and a source voltage;
- generating a DLL source clock signal by performing an AND operation of the internal clock signal and the second division clock signal;
- generating a feedback clock signal by modeling the DLL source clock signal with delay factors of the memory device; and
- controlling a delay amount of the DLL source clock signal by comparing the feedback clock signal with the reference clock signal.

* * * * *